US005667932A

United States Patent [19]
Sato et al.

[11] Patent Number: 5,667,932
[45] Date of Patent: Sep. 16, 1997

[54] POSITIVE PHOTORESIST COMPOSITION

[75] Inventors: Kenichiro Sato; Kunihiko Kodama; Makoto Momota, all of Shizuoka, Japan

[73] Assignee: Fuji Photo Film Co., Ltd., Kanagawa, Japan

[21] Appl. No.: 651,849

[22] Filed: May 21, 1996

[30] Foreign Application Priority Data

May 24, 1995 [JP] Japan ................... 7-125194

[51] Int. Cl.$^6$ .................................................. G03F 7/023
[52] U.S. Cl. ..................... 430/192; 430/165; 430/191; 430/193
[58] Field of Search .................. 430/165, 192, 430/193, 191

[56] References Cited

U.S. PATENT DOCUMENTS

| | | | |
|---|---|---|---|
| 5,407,779 | 4/1995 | Uetani et al. | 430/192 |
| 5,494,773 | 2/1996 | Tan et al. | 430/192 |
| 5,514,515 | 5/1996 | Zampini et al. | 430/192 |
| 5,534,382 | 7/1996 | Kawabe et al. | 430/192 |

*Primary Examiner*—John S. Chu
*Attorney, Agent, or Firm*—Sughrue, Mion, Zinn, Macpeak & Seas

[57] ABSTRACT

Disclosed is a positive photoresist composition comprising an alkali-soluble resin and 1,2-naphthoquinonediazide-5- (and/or -4-)sulfonic esters of a polyhydroxy compound having a particular structure consisting of 5 aromatic rings linked linearly, in which each of the aromatic rings contains a hydroxyl group and the respective aromatic rings next to both the terminal rings contains a substituent group at the 5-position to the hydroxyl group thereof. The positive photoresist composition which has high resolution, low dependence of the resolution on film thickness, and broad latitude of development, leaves little development residue, and has very excellent storage stability without separation of photosensitive materials and generation of microgel (no increase in particle) with a lapse of time.

4 Claims, No Drawings

5,667,932

POSITIVE PHOTORESIST COMPOSITION

FIELD OF THE INVENTION

The present invention relates to a positive photoresist composition which comprises an alkali-soluble resin and a specific 1,2-quinonediazide compound and is sensitive to radiant rays such as ultraviolet rays, far ultraviolet rays, X rays, electron beams, molecular beams, γ rays, and synchrotron radiations. Particularly, it relates to a positive photoresist composition suitable for fine processing which exhibits high resolution without depending on the variation of film thickness, leaves little development residue, and has an excellent latitude of development and, in addition, a good stability with a lapse of time.

The positive photoresist composition prepared according to the present invention is applied to a substrate such as semiconductor wafers, glass, ceramics, and metals by a spin coating method or a roller coating method so as to be 0.5 to 2 μm in thickness, and then heated to be dried. A circuit pattern is printed on the thus prepared film by irradiating with a ray such as a ultraviolet ray through an exposure mask. The film may be subjected to post exposure bake, as needed, and is developed to form a positive image.

Etching is effected using this positive image as a mask to form a processed pattern on the substrate. Typical fields to which this technique can be applied include processes for manufacturing semiconductors such as integrated circuits, processes for manufacturing circuit substrates for liquid crystals, thermal heads and so forth, and processes for other photofabrication.

BACKGROUND OF THE INVENTION

Compositions which contain an alkali-soluble resin binder such as a novolak resin and a naphthoquinonediazide compound as a photosensitive material have been generally used as a positive photoresist composition.

As the binder, a novolak resin is particularly useful, because it is soluble in an aqueous alkali solution without swelling and offers high resistance, particularly to plasma etching when an image formed is used as a mask for etching. The naphthoquinonediazide compound, which is used as the photosensitive material, itself acts as a dissolution inhibitor to lower alkali solubility of the novolak resin. However, when the naphthoquinone-diazide compound is decomposed by irradiation with light to form an alkali-soluble substance, the alkali solubility of the novolak resin is increased. Due to such a great change in nature which depends on light, the naphthoquinonediazide compound is particularly useful as the photosensitive material for the positive photoresists.

From this standpoint, a number of positive photoresist compositions containing a novolak resin and a naphthoquinonediazide photosensitive material have hitherto been developed and put to practical use. Particularly, such photoresists are making remarkable progress toward high resolution to achieve striking results with regard to processing of line width up to submicron.

To obtain higher resolution and reproduce an image having a better pattern shape, use of a photoresist having a higher contrast (γ value) has been considered advantageous and the development of such photoresist compositions has been carried out. There are a great number of publications in which such techniques are disclosed. With respect to the novolak resins, one of the main components of the positive photoresist composition, a number of patent applications disclose specific compositions of monomers, distributions of molecular weight, and processes for the preparation of the novolak resins, providing an improvement to some extent. Also with respect to the photosensitive material, the other main component, a number of compounds having structures which are recognized as effective for obtaining a higher contrast have been disclosed. When positive photoresists are designed with the aid of these techniques, it is possible to develop a resist having extra high resolving power so that a pattern having a dimension similar to wavelength of light can be resolved.

On the other hand, the integrated circuits increasingly need higher integrity thereof. In a process for the manufacture of semiconductor substrates such as extra large scale integration, it comes to be required to process an ultra fine pattern consisting of a line width of 0.5 μm or less. Such uses require the photoresists to have high resolution and a broad latitude of development to constantly ensure a definite line width. In addition, to prevent processing defects of the circuits, the photoresists are required to leave no photoresist residue on the patterns after development.

Further, particularly in the formation of the ultra fine pattern consisting of the line width of 0.5 μm or less, it has been found that, even if the photoresists have good resolution in a certain thickness, a phenomenon that the slightest change in thickness causes the resolution to be deteriorated (hereinafter referred to as "dependence on film thickness") is observed. Surprisingly, even when the thickness changes only by a few hundredths μm, the resolution considerably changes, and any one of typical positive photoresists which are now commercially available has also been found to exhibit this tendency more or less. Specifically, when the thickness of a resist film before exposure changes from a certain film thickness in the range of λ/4 n (λ represents the wavelength of an exposing ray; and n represents the refractive index of a resist film at this wavelength), the resolution also changes depending upon the change in film thickness.

The presence of this problem, the dependence on film thickness, is pointed out, for example, in *SPIE Proceedings*, Vol. 1925, p. 626 (1993), and it is described therein that a multiple reflective effect of a ray inside a resist film causes the problem.

There are many cases where an increase of the contrast of a resist to obtain high resolution and a pattern having a rectangular shape in its cross section causes the dependence on film thickness to increase. In fact, on processing a semiconductor substrate, a pattern is compelled to be formed on a resist film which has subtly different thickness all over the surface, because of unevenness on the surface of the substrate and irregularity in film thickness caused by coating. Therefore, the dependence on film thickness becomes an obstacle to a positive photoresist in which a ultra fine processing must be conducted to an almost full extent of limitation of the resolution.

Further, requirements for particles of positive photoresists are more and more increasing with the promotion of integration in semiconductors. In the semiconductors, particles having sizes of a tenth or more of the least line width of a device have the effect on the yield, as generally indicated by the 1/10 rule (*Ultra Clean Technology*, Vol. 3, No. 1, p. 79 (1991), etc.).

To decrease these particles, use of an ultra fine filter having a pore diameter of 0.1 μm or 0.05 μm during the manufacturing step of resists is devised. This is, in fact, useful for the reduction of such particles on manufacturing the resists.

However, in spite of the reduction of particles at the manufacturing step of a resist, the number of particles in a resist often increases with a lapse of time. The increase in particles with time is almost caused by 1,2-quinonediazides which are used as the photosensitive material. Various attempts have been hitherto made to prevent the number of particles to increase with time.

Examples of such attempts include a method of using a photosensitive material in which part of hydroxy groups of a polyhydroxy compound undergo acylation or sulfonylation (JP-A-62-178562; the term "JP-A" as used herein means an "unexamined published Japanese patent application"), a method of using a mixture of 1,2-naphthoquinonediazide-4-and -5-sulfonic esters (JP-A-62-284354), a method of using a heat-modified 1,2-naphthoquinonediazide as a photosensitive material (JP-A-63-113451), a method of decreasing a catalyst remaining in a photosensitive material (JP-A-63-236030), a method of synthesizing a photosensitive material in the presence of an anion exchange resin (JP-A-63-236031), and a method of mixing a solvent which has excellent solubility for photosensitive materials (JP-A-61-260239 and JP-A-1-293340).

To improve the resolution, a large number of 1,2-naphthoquinonediazides of polyhydroxy compounds having particular structures have hitherto been proposed. Examples thereof are disclosed in JP-A-57-63526, JP-A-60-163043, JP-A-62-10645, JP-A-62-10646, JP-A-62-150245, JP-A-63-220139, JP-A-64-76047, JP-A-1-189644, JP-A-2-285351, JP-A-2-296248, JP-A-2-296249, JP-A-3-48249, JP-A-3-48250, JP-A-3-158856, JP-A-3-228057, JP-W-4-502519 (The term "JP-W" as used herein means an unexamined published international patent application), U.S. Pat. Nos. 4,957,846, 4,992,356, 5,151,340, and 5,178,986, European Patent 530,148, and so forth. However, use of these photosensitive materials has been still insufficient with regard to decrease in the dependence on film thickness.

On the other hand, resists having a high contrast and high resolution are obtained by use of photosensitive materials containing hydroxyl groups in molecule as described in JP-B-37-18015, JP-A-58-150948, JP-A-2-19846, JP-A-2-103543, JP-A-3-228057, JP-A-5-323597, JP-A-6-148878, JP-A-6-167805, JP-A-6-202321, U.S. Pat. Nos. 3,061,430, 3,130,047, 3,130,048, 3,130,049, 3,102,809, 3,184,310, 3,188,210, and 3,180,733, West German Patent No. 938,233, *SPIE Proceedings*, Vol. 631, p. 210, ibid., Vol. 1672, p. 231 (1992), ibid, vol. 1672, p. 262 (1992), and ibid., Vol. 1925, p. 227 (1993).

However, the photosensitive materials containing hydroxyl groups in molecule which are described in the above-mentioned specifications are not sufficiently satisfactory, because of further increased requisitions accompanied by the promotion of integration of the semiconductors.

SUMMARY OF THE INVENTION

An object of the present invention is to provide a positive photoresist composition which exhibits high resolution, low dependence of resolution on film thickness, and very excellent storage stability without deposition of photosensitive materials or generation of microgel during storage, i.e., free from increase in the number of particles.

The present inventors have paid attention to the above-mentioned characteristics and, as a result, found that the object of the invention can be accomplished by using an alkali-soluble resin and a quinonediazide compound having a particular structural formula, thus completing the present invention.

That is, the object of the present invention can be achieved by a positive photoresist composition comprising an alkali-soluble resin and at least one of 1,2-naphthoquinonediazide-5- (and/or -4-)sulfonic esters of polyhydroxy compounds represented by the following general formula (I) or general formula (II):

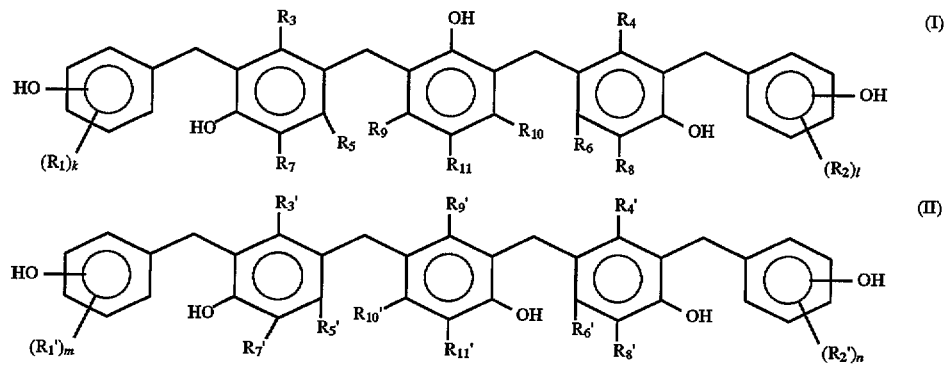

wherein $R_1$ and $R_2$, and $R_1'$ and $R_2'$, which may be the same or different, each represents a hydrogen atom, a halogen atom, an alkyl group, an aryl group, an alkoxy group, an acyl group, or a cycloalkyl group; $R_3$ and $R_4$, and $R_3'$ and $R_4'$, which may be the same or different, each represents an alkyl group or a halogen atom; $R_5$ and $R_6$, and $R_5'$ and $R_6'$, which may be the same or different, each represents a hydrogen atom, an alkyl group, or an alkoxy group; $R_7$ and $R_8$, and $R_7'$ and $R_8'$, which may be the same or different, each represents an alkyl group, an alkoxy group, an alkenyl group, or a cycloalkyl group; $R_9$ and $R_{10}$, and $R_9'$ and $R_{10}'$, which may be the same or different, each represents a hydrogen atom or an alkyl group; $R_{11}$ and $R_{11}'$ each represents a cycloalkyl group; and k to n each represents an integer of from 0 to 3.

In the present invention, the term "dependence on film thickness" as used herein means fluctuation in resolution of a resist obtained by exposure, (bake, as needed), and development, when the film thickness of the resist changes in the range of λ/4 n before exposure.

DETAILED DESCRIPTION OF THE INVENTION

The present invention is described in detail below.

It is not clear why use of the photosensitive materials of the present invention brings about peculiarly high resolution, satisfactory dependence on film thickness, broad latitude of development, little generation of development residue, and very excellent stability for storage. However, these peculiar effects seem to stem from the following structural features of the photosensitive materials; 1) to have a straight-chain structure, 2) to contain 5 aromatic rings, and to have an alkyl group or a halogen atom introduced at the 5-position (between methylene chains) to the respective hydroxyl groups of aromatic rings next to both terminal rings, 3) to contain a hydroxyl group in the respective aromatic rings, and 4) to contain a cycloalkyl group in the molecule.

In the above-mentioned general formulas (I) and (II), the alkyl group represented by $R_1$ to $R_{10}$ and $R_1'$ to $R_{10}'$ is preferably an alkyl group having 1 to 4 carbon atoms such as a methyl group, an ethyl group, a propyl group, an isopropyl group, an n-butyl group, an isobutyl group, a sec-butyl group, and a tert-butyl group, and more preferably a methyl group. The halogen atom represented by $R_1$ to $R_4$ and $R_1'$ to $R_4'$ in formulas (I) and (II) is preferably a chlorine atom, a bromine atom, or an iodine atom. The aryl group represented by $R_1$ and $R_2$, and $R_1'$ and $R_2'$ is preferably a phenyl group, a toluyl group, a xylyl group, a mesityl group, or a cumenyl group. The alkoxy group represented by $R_1$ and $R_2$, $R_5$ to $R_8$, $R_1'$ and $R_2'$, and $R_5'$ to $R_8'$ is preferably a methoxy group, an ethoxy group, a propoxy group, an isopropoxy group, an n-butoxy group, an isobutoxy group, a sec-butoxy group, or a tert-butoxy group. The acyl group represented by $R_1$ and $R_2$, and $R_1'$ and $R_2'$ is preferably a formyl group, an acetyl group, or a benzoyl group. The alkenyl group represented by $R_7$ and $R_8$, and $R_7'$ and $R_8'$ is preferably a vinyl group, a propenyl group, or an allyl group. In formulas (I) and (II), the cycloalkyl group represented by $R_1$ and $R_2$, $R_7$ and $R_8$, $R_{11}$, $R_1'$ and $R_2'$, $R_7'$ and $R_8'$, and $R_{11}'$ is preferably a cyclopentyl group or a cyclohexyl group, and more preferably a cyclohexyl group. k, l, m, and n each represents an integer of from 0 to 3. k is preferably 0, 1, or 2, and more preferably, 0 or 1.

In the above-mentioned general formulas (I) and (II), examples of preferred substituent groups on the nuclei are as follows: $R_1$, $R_2$, $R_1'$ and $R_2'$ each is preferably a hydrogen atom, a methyl group, a chlorine atom, or a methoxy group. $R_3$, $R_4$, $R_3'$ and $R_4'$ each is preferably a methyl group or a chlorine atom, and more preferably a methyl group. $R_5$, $R_6$, $R_5'$ and $R_6'$ each is preferably a hydrogen atom or a methyl group. $R_7$, $R_8$, $R_7'$ and $R_8'$ each is preferably a methyl group or an allyl group. $R_9$, $R_{10}$, and $R_{10}'$ each is preferably a hydrogen atom or a methyl group. $R_{11}$ and $R_{11}'$ each is preferably a cyclohexyl group.

Examples of the compounds represented by the general formulas (I) and (II) include the following (I-1) to (I-5) and (II-1) to (II-4). However, compounds which can be used in the present invention are not limited to these examples. These polyhydroxy compounds are used singly or as mixtures of 2 or more kinds thereof.

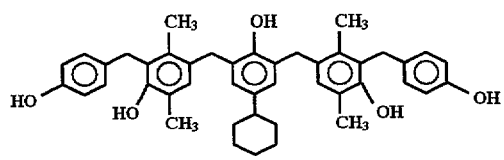

(I-1)

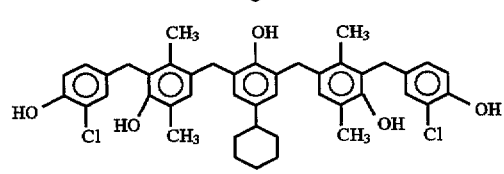

(I-2)

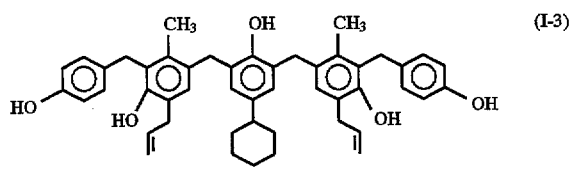

(I-3)

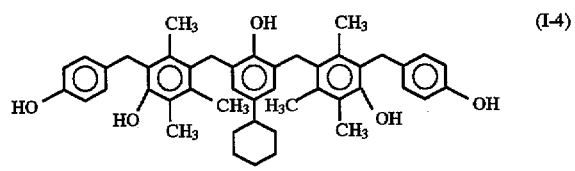

(I-4)

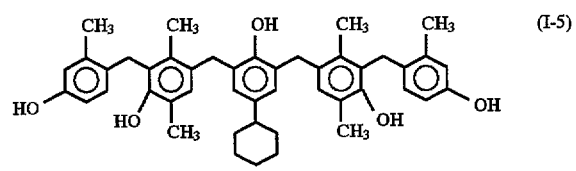

(I-5)

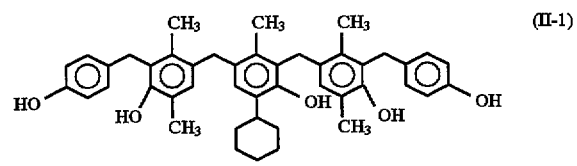

(II-1)

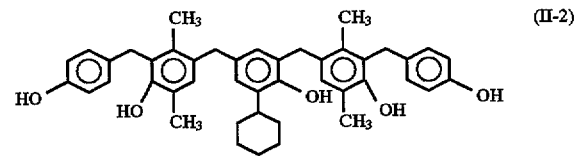

(II-2)

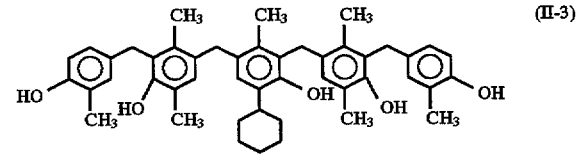

(II-3)

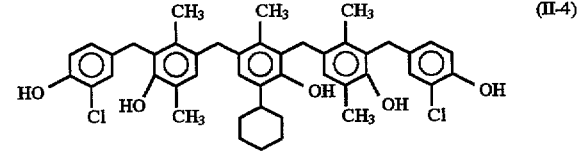

(II-4)

The photosensitive materials of the present invention are prepared, for example, by an esterification reaction of one of the above-mentioned polyhydroxy compounds with 1,2-naphthoquinonediazide-5- (and/or -4-)sulfonyl chlorides in the presence of a basic catalyst.

That is, respective certain amounts of a polyhydroxy compound and 1,2-naphthoquinone-diazide-5- (and/or -4-) sulfonyl chlorides are placed in a flask together with at least one of solvents such as methyl isobutyl ketone, diglyme, ethyl acetate, acetonitrile, dichloroethane, dioxane, acetone, tetrahydrofuran, methyl ethyl ketone, N-methylpyrrolidone, chloroform, trichloroethane, trichloro-ethylene, and γ-butyrolactone, and a basic catalyst such as sodium hydroxide, sodium carbonate, sodium hydrogencarbonate, triethylamine, 4-dimethylaminopyridine, 4-methylmorpholine, N-methylpiperazine, and N-methylpiperidine is added dropwise to the mixture to condense the polyhydroxy compound with 1,2-naphthoquinonediazide-5- and/or -4-sulfonyl chlorides. A product thus prepared is precipitated in water, washed with water, purified, and then dried.

The molar ratio of 1,2-naphthoquinonediazide-5- (and/or -4-)sulfonyl chlorides to the polyhydroxy compound represented by the above-mentioned general formulas (I) and (II) (1,2-naphthoquinonediazide/polyhydroxy compound) preferably ranges from 1.2 to 3.8, and more preferably from 1.5 to 3.5. The molar ratio within this range leaves a certain amount of an unreacted polyhydroxy compound to effectively attain the object of the present invention. If the molar ratio of the starting materials do not reach this range, a marked reduction of film in unexposed areas is liable to be caused. On the contrary, if it exceeds this range, the stability during storage is liable to be poor.

In the present invention, a 1,2-naphthoquinone-diazide-5-sulfonic ester can also be used together with a 1,2-naphthoquinonediazide-4-sulfonic ester, as needed. Temperatures of the reaction carried out by the above-mentioned method generally range from −20° to 60° C., and preferably from 0° to 40° C.

When the photosensitive material of the present invention is used as a resin composition, one kind or two kinds or more of the photosensitive material is blended with an alkali-soluble resin. The content of the photosensitive material of the present invention is generally from 5 to 150 parts by weight, and preferably from 20 to 100 parts by weight per 100 parts by weight of the alkali-soluble resin. If the content is less than 5 parts by weight, there is a possibility that a film-remaining ratio is markedly lowered. If it exceeds 150 parts by weight, there is a possibility that the sensitivity and the solubility in solvent are decreased.

The photosensitive material of the present invention can be used in combination with esterified products prepared from 1,2-naphthoquinonediazide-5- (and/or -4-)sulfonyl chlorides and the following polyhydroxy compounds, if desired. The amount of naphthoquinonediazide esters of these polyhydroxy compounds is 80% by weight or less based on the whole photosensitive material including the photosensitive material of the present invention. That is, when the ratio of the photosensitive material of the present invention does not reach 20% by weight based on the whole photosensitive material, the resulting resist may fail to offer the sufficient effect of the present invention.

Examples of the polyhydroxy aromatic compound include polyhydroxybenzophenones such as 2,3,4-trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydroxybenzophenone, 2,4,6,3',4',5'-hexahydroxybenzophenone and 2,3,4,3',4',5'-hexahydroxybenzophenone; polyhydroxyphenylalkyl ketones such as 2,3,4-trihydroxyacetophenone and 2,3,4-trihydroxyphenylhexyl ketone; bis((poly)hydroxyphenyl) alkanes such as bis(2,4-dihydroxyphenyl)methane, bis(2,3,4-trihydroxyphenyl)methane and bis (2,4-dihydroxyphenyl)propane-1; polyhydroxybenzoates such as propyl 3,4,5-trihydroxybenzoate and phenyl 3,4,5-trihydroxybenzoate; bis(polyhydroxybenzoyl)alkanes or bis(polyhydroxybenzoyl)aryls such as bis(2,3,4-trihydroxybenzoyl)methane and bis(2,3,4-trihydroxybenzoyl)benzene; alkylene di(polyhydroxybenzoates) such as ethylene glycol di(3,5-dihydroxybenzoate); polyhydroxybiphenyls such as 3,5,3',5'-biphenyltetrol, 2,4,2',4'-biphenyltetrol, 2,4,6,3',5'-biphenylbentol and 2,4,6,2',4',6'-biphenylhexol; polyhydroxytriphenylmethanes such as 4,4',4"-trihydroxy-3,5,3',5'-tetramethyltriphenylmethane, 4,4',4"-trihydroxy-3"-methoxy-3,5,3',5'-tetramethyltriphenylmethane, 4,4',2"-trihydroxy-3,5,3',5'-tetramethyltriphenylmethane, 4,4',2"-trihydroxy-2,2'-dimethyl-5,5'-dicyclohexyltriphenylmethane, 4,4',2"-trihydroxy-2,5,2',5'-tetramethyltriphenylmethane, 4,4',3",4"-tetrahydroxy-3,5,3',5'-tetramethyltriphenylmethane, 4,4',2",3",4"-pentahydroxy-3,5,3',5'-tetramethyltriphenylmethane and 2,3,4,2',3',4',3",4"-octahydroxy-5,5'-diacetyltriphenylmethane; polyhydroxyspirobiindanes such as 3,3,3',3'-tetramethyl-1,1'-spirobiindane-5,6,5',6'-tetrol, 3,3,3',3'-tetramethyl-1,1'-spirobiindane-5,6,7,5',6',7'-hexol, 3,3,3',3'-tetramethyl-1,1'-spirobiindane-4,5,6,4',5',6'-hexol and 3,3,3',3'-tetramethyl-1,1'-spirobiindane-4,5,6,5',6',7'-hexol; polyhydroxyphthalides such as 3,3-bis(3,4-dihydroxyphenyl)phthalide, 3,3-bis(2,3,4-trihydroxyphenyl)phthalide, 3',4',5',6'-tetrahydroxyspiro (phthalide-3,9'-xanthene; polyhydroxybenzopyranes such as 2-(3,4-dihydroxyphenyl)-3,5,7-trihydroxybenzopyrane, 2-(3,4,5-trihydroxyphenyl)-3,5,7-trihydroxybenzopyrane, 2-(3,4-dihydroxyphenyl)-3-(3,4,5-trihydroxybenzoyloxy)-5,7-dihydroxybenzopyrane and 2-(3,4,5-trihydroxyphenyl)-3-(3,4,5-trihydroxybenzoyloxy)-5,7-dihydroxybenzopyrane; polyhydroxyphenylchromans such as 2,4,4-trimethyl-2-(2',4'-dihydroxyphenyl)-7-hydroxychroman, 2,4,4-trimethyl-2-(2',3',4'-trihydroxyphenyl)-7,8-dihydroxychroman and 2,4,4-trimethyl-2-(2',4',6'-trihydroxyphenyl)-5,7-dihydroxychroman; hydroxybenzylphenols such as 2,6-bis(2,3,4-trihydroxybenzyl)-4-methylphenol, 2,6-bis(2,4-dihydroxybenzyl)-4-methylphenol, 2,6-bis(5-chloro-2,4-dihydroxybenzyl)-4-methylphenol, 2,6-bis(2,4,6-trihydroxybenzyl)-4-methylphenol, 2,6-bis(2-acetyl-3,4,5-trihydroxybenzyl)-4-methylphenol, 2,4,6-tris(2,3,4-trihydroxybenzyl)phenol, 2,6-bis(3,5-dimethyl-4-hydroxybenzyl)-4-methylphenol, 2,6-bis(2,5-dimethyl-4-hydroxybenzyl)-4-methylphenol, 2,6-bis(2,5-dimethyl-4-hydroxybenzyl)-4-phenylphenol, 2,6-bis(2,5-dimethyl-4-hydroxybenzyl)-4-cyclohexylphenol, 2,6-bis(4-hydroxybenzyl)-4-cyclohexylphenol, 2,6-bis{3'-(4"-hydroxybenzyl)-4'-hydroxy-5'-methylbenzyl}-4-cyclohexylphenol, 2,6-bis{3'-(3"-methyl-4"-hydroxybenzyl)-4'-hydroxy-5'-methylbenzyl}-4-cyclohexylphenol, 2,4,6-tris(3,5-dimethyl-4-hydroxybenzyl)phenol, 4,6-bis(3,5-dimethyl-4-hydroxybenzyl)pyrogallol, 2,6-bis(3-methyl-4-hydroxybenzyl)-4-methylphenol and 2,6-bis(3,5-dimethyl-4-hydroxybenzyl)phloroglucinol; biphenols such as 2,2'-dihydroxy-5,5'-bis(4"-hydroxybenzyl)biphenol, 2,2'-dihydroxy-3,3'-dimethoxy-5,5'-bis(4"-hydroxybenzyl) biphenol, 2,2'-dihydroxy-3,3'-dimethoxy-5,5'-bis(3",5"-dimethyl-4"-hydroxybenzyl)biphenol, 2,2'-dihydroxy-3,3'-dimethoxy-5,5'-bis(3"-methyl-4"-hydroxybenzyl)biphenol and 4,4'-dihydroxy-3,3'-dimethyl-5,5'-bis(3",5"-dimethyl-4"-hydroxybenzyl)biphenol; hydroxyphenylalkanes such as 1,3,3,5-tetrakis(4-hydroxyphenyl)pentane, 1,1-bis{3'-(4"-hydroxybenzyl)-4'-hydroxy-5'-methylphenyl}-cyclohexane, 1,1-bis{3'-(3"-methyl-4"-hydroxybenzyl)-4'-hydroxy-5'-methylphenyl}cyclohexane, 1,1-bis{3'-(3", 6"-dimethyl-4"-hydroxybenzyl)-4'-hydroxy-5'-methylphenyl}-cyclohexane, 4,4'-methylenebis{2-(4"-hydroxybenzyl)-3,6-dimethylphenol}, 4,4'-methylenebis{2-(3"-methyl-4"-hydroxybenzyl)-3,6-dimethylphenol}, 4,4'-methylenebis{2-(3"-methyl-4"-hydroxybenzyl)-3-cyclohexyl-6-methylphenol}, 4,4'-methylenebis{2-(2",4"-dihydroxybenzyl)-6-methylphenol}, 1,8-bis{3'-(4"-hydroxybenzyl)-4'-hydroxy-5'-methylphenyl}methane and 1,8-bis{3'-(3"-methyl-4"-hydroxybenzyl)-4'-hydroxy-5'-methylphenyl}methane; diphenyl ethers such as 3,3'-bis(4"-hydroxybenzyl)-4,4'-dihydroxy-5,5"-diallyldiphenyl ether, 3,3'-bis{4"-hydroxybenzyl)-4,4'-dihydroxy-5,5"-dimethyldiphenyl thioether,3,3'-bis(3"-methyl-4"-hydroxybenzyl)-4,4'-dihydroxy-5,5"-dimethyldiphenyl thioether, 3,3'-bis(3",6"-dimethyl-4"-hydroxybenzyl)-4,4'-dihydroxy-5,5"-dimethyldiphenyl thioether and 3,3'-bis(3"-methyl-4"-hydroxybenzyl)-4,4'-dihydroxy-5,5"-diallyldiphenyl ether; sulfonamidophenols such as 2,6-bis(4'-hydroxybenzyl)-4-benzenesulfonamidophenol and 2,6-bis(3',6'-dimethyl-4'-hydroxybenzyl)-4-benzenesulfonamidophenol; flavonoid such as quercetin and rutin; and low nuclides of novolak and analogues thereof.

The polymer containing an aromatic hydroxyl group such as acetone-pyrogallol condensed resin or polyvinylphenol may be used in place of the low molecular weight compound. Further, the hydroxyl group of the novolak by itself may be replaced by an appropriate amount of quinonediazide to work also as a photosensitive material or a binder.

Among these, particularly preferred are those having at least three hydroxyl groups in total and a moiety comprising at least one aromatic hydroxyl group on the same aromatic ring. Examples of the 1,2-naphthoquinonediazide-5-(and/or -4-)-sulfonic ester compound of known aromatic or aliphatic polyhydroxy compounds include compounds described in JP-B-56-2333 (the term "JP-B" as used herein means an "examined Japanese patent publication"), JP-B-62-3411, JP-B-3-2293, JP-B-3-42656, JP-A-58-150948, JP-A-60-154249, JP-A-60-134235, JP-A-62-10646, JP-A-62-153950, JP-A-60-146234, JP-A-62-178562, JP-A-63-113451, JP-A-64-76047, JP-A-1-147538, JP-A-1-189644, JP-A-1-309052, JP-A-2-19846, JP-A-2-84650, JP-A-2-72363, JP-A-2-103543, JP-A-2-285351, JP-A-2-296248, JP-A-2-296249, JP-A-3-48251, JP-A-3-48249, JP-A-3-119358, JP-A-3-144454, JP-A-3-185447, JP-A-4-1652, JP-A-4-60548, JP-A-5-158234, JP-A-5-224410, JP-A-5-303198, JP-A-5-297580, JP-A-5-323597, Japanese Patent Application Nos. 5-251781, 5-251780 and 5-233537, U.S. Pat. Nos. 4,797,345, 4,957,846, 4,992,356, 5,151,340 and 5,178,986, and European Patents 530,148 and 573,056.

Examples of the alkali-soluble resin for use in the present invention include novolak resin, acetone-pyrogallol resin, and polyhydroxystyrene and a derivative thereof.

Among these, particularly preferred is the novolak resin which can be obtained by addition-condensing a predetermined monomer as a main component with an aldehyde in the presence of an acidic catalyst.

Examples of the predetermined monomer include phenol, cresols such as m-cresol, p-cresol and o-cresol, xylenols such as 2,5-xylenol, 3,5-xylenol, 3,4-xylenol and 2,3-xylenol, alkylphenols such as m-ethylphenol, p-ethylphenol, o-ethylphenol and p-t-butylphenol, trialkylphenols such as 2,3,5-trimethylphenol and 2,3,4-trimethylphenol, alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol and p-butoxyphenol, bisalkylphenols such as 2-methyl-4-isopropylphenol and hydroxy aromatic compounds such as m-chlorophenol, p-chlorophenol, o-chlorophenol, dihydroxybiphenyl, bisphenol A, phenylphenol, resorcinol and naphthol, and these monomers may be used either individually or in combination of two or more thereof, however, the present invention is by not means limited thereto.

Examples of the aldehydes include formaldehyde, paraformaldehyde, acetaldehyde, propylaldehyde, benzaldehyde, phenylacetoaldehyde, α-phenylpropylaldehyde, α-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaidehyde, p-n-butylbenzaldehyde, furfural, chloroacetaldehyde and an acetalized product of these such as chloroacetaldehydediethylacetal, and among these, formaldehyde is preferred.

These aldehydes are used either individually or in combination.

Examples of the acidic catalyst include a hydrochloric acid, a sulfuric acid, a formic acid, an acetic acid and an oxalic acid.

Also, techniques disclosed in JP-A-60-45238, JP-A-60-94347, JP-A-60-140235, JP-A-60-189739, JP-A-64-14229, JP-A-1-276131, JP-A-2-60915, JP-A-2-275955, JP-A-2-282745, JP-A-4-101147 and JP-A-4-122938, namely, those resulting from removing or reducing the low molecular weight component of the novolak resin are preferably used.

The thus-obtained novolak resin preferably has a weight average molecular weight of from 1,500 to 25,000. If the weight average molecular weight is less than 1,500, the film loss on the unexposed area after development is liable to be large, whereas if it exceeds 25,000, the development rate is liable to be reduced. The weight average molecular weight as used herein is defined by a polystyrene conversion value in gel permeation chromatography.

The dispersibility of the novolak resin (the ratio of the weight average molecular weight (Mw) to the number average molecular weight (Mn), namely, Mw/Mn) is preferably from 1.5 to 7.0, more preferably from 1.5 to 5.0. If the dispersibility exceeds 7, there is a possibility that the effect of the present invention cannot be achieved, whereas if the dispersibility is less than 1.5, a purification process on a high level is required in the synthesis of the novolak resin and this is unreal in practice and improper.

The weight average molecular weight and the dispersibility of the novolak resin may be properly set depending on the kind of the novolak resin.

In the case when the alkali-soluble resin is a novolak resin synthesized by the condensation reaction of a mixture containing two or more of phenol, cresol, xylenol and trimethylphenol and containing m-cresol as an essential component, with an aldehyde compound, the weight average molecular weight is preferably from 5,500 to 25,000, more preferably from 6,000 to 25,000. The ratio of the weight average molecular weight to the number average molecular weight of the above-described novolak resin is preferably from 1.5 to 5.0.

In the case where the alkali-soluble resin is at least one novolak resin synthesized by the condensation reaction of a mixture containing at least four of p-cresol, o-cresol, 2,3-xylenol, 2,6-xylenol and trimethylphenol and containing o-cresol as an essential component, with an aldehyde compound, the ratio of the weight average molecular weight to the number average molecular weight is preferably from 1.5 to 5.0 and the weight average molecular weight is preferably from 1,500 to 6,000.

As described above, depending upon the kind of the novolak resin used, the weight average molecular weight and the dispersibility are properly set to a predetermined range and thereby the effect of the present invention can be provided more outstandingly.

The low molecular weight compound having a phenolic hydroxyl group (water-insoluble alkali-soluble low molecule) which can be used in the present invention is described below.

The composition of the present invention preferably contains a water-insoluble alkali-soluble low molecule for the purpose of acceleration of dissolution in the developer. By containing it, the development latitude can be improved.

Specific examples of the water-insoluble alkali-soluble low molecule include polyhydroxy compounds. Preferred examples of the polyhydroxy compound include phenols, resorcin, phloroglucin, 2,3,4-trihydroxybenzophenone, 2,3, 4,4'-tetrahydroxybenzophenone, 2,3,4,3',4',5'-hexahydroxybenzophenone, acetone-pyrogallol condensed resin, phloroglucide, 2,4,2',4'-biphenyltetrol, 4,4'-thiobis(1, 3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl) methane, 1,1-bis(4-hydroxyphenyl)cyclohexane, 4,4'-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris (hydroxyphenyl)propane, 1,1,2-tris(3,5-dimethyl-4-hydroxyphenyl)propane, 2,2,5,5-tetrakis(4-hydroxyphenyl) hexane, 1,2-tetrakis(4-hydroxyphenyl)ethane, 1,1,3-tris (hydroxyphenyl)butane and para[α,α,α',α'-tetrakis(4-hydroxyphenyl)]xylene.

Among these, water-insoluble alkali-soluble low molecular weight compounds having a total carbon number in one molecule of 60 or less and from 2 to 8 phenolic hydroxyl groups in one molecule are preferred.

Further, the water-insoluble alkali-soluble low molecular weight compound is preferably at least one water-insoluble alkali-soluble low molecular weight compound in which the ratio of the phenolic hydroxyl group to the aromatic ring is from 0.5 to 1.4, the total number of carbon atoms present in the molecule is from 12 to 60, and the number of the phenolic hydroxyl groups present in the molecule is from 2 to 10. Among these, particularly preferred are the compounds which, upon addition to a water-insoluble alkali-soluble resin, increase the alkali dissolution rate of the alkali-soluble resin. By using such a compound, the development latitude may be still further improved.

If the carbon number of the compound exceeds 60, the effect of the present invention is liable to be reduced, whereas if it is less than 12, other problems such as reduction in the heat resistance may newly arise. In order to achieve the effect of the present invention, it is necessary to have at least two hydroxyl groups in the molecule, but if the number of hydroxyl groups exceeds 10, the improvement effect on the development latitude may be lost. Further, if the ratio of the phenolic hydroxyl group to the aromatic ring is less than 0.5, the film thickness dependency is liable to be large and also, the development latitude is liable to be narrow, whereas if the ratio exceeds 1.4, there is a possibility that the stability of the composition is deteriorated and it becomes disadvantageously difficult to obtain high resolution and good film thickness dependency.

The preferred addition amount of the low molecular weight compound is from 1 to 100 % by weight, more preferably from 2 to 80 % by weight, based on the alkali-soluble resin. If the addition amount exceeds 100 % by weight, other problems such as worsening of the development residue or deformation of a pattern upon development disadvantageously arise.

The water-insoluble alkali-soluble low molecular weight compound having an aromatic hydroxyl group for use in the present invention can be easily synthesized by one skilled in the art by referring to the description, for example, in JP-A-4-122938, JP-A-2-28531, JP-A-2-242973, JP-A-2-275995, JP-A-4-251849, JP-A-5-303199, JP-A-5-22440, JP-A-6-301204, U.S. Pat. Nos. 4,916,210, 5,210,657 and 5,318,875 and European Patent 219,294.

Examples of a solvent which can be used to dissolve the photosensitive material and alkali-soluble novolak resin in the present invention include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, and butyl acetate. These organic solvents can be used singly or as a mixture of 2 or more kinds thereof.

Further, a high boiling point solvent such as N-methylformamide, N,N-dimethylformamide, N-methylacetamide, N,N-dimethylacetamide, N-methylpyrrolidone, dimethylsulfoxide or benzyl ethyl ether may be used in combination.

The positive photoresist composition of the present invention may contain a surface active agent so as to improve coatability such as striation.

Examples of the surface active agent include a nonionic surface active agent such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylaryl ethers (e.g., polyoxyethylene octylphenol ether, polyoxyethylene nonylphenol ether), sorbitan fatty acid esters (e.g., sorbitan monolaurate, sorbitan monopalmitate, sorbitan monostearate, sorbitan monooleate, sorbitan trioleate, sorbitan tristearate), polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); a fluorine-base surface active agent such as Eftop EF301, EF303, EF352 (produced by Shin Akita Kasei KK), Megafac F171, F173 (produced by Dainippon Ink & Chemicals, Inc.), Florade FC430, 431 (produced by Sumitomo 3M KK), Asahiguard AG710, Surfron S-382, SC101, SC102, SC103, SC104, SC105 and SC106 (produced by Asahi Glass KK); an organosiloxane polymer KP341 (produced by Shin-Etsu Chemical Co., Ltd.); and an acrylic acid-base or methacrylic acid-base (co)polymer, Polyflow No. 75, No. 95 (produced by Kyoei Sya Yushi Kagaku Kogyo KK). The fluorine-base or silicone-base surface active agent is preferably used. The compounding amount of the surface active agent is usually 2 parts by weight or less, preferably 1 part by weight or less, per 100 parts by weight of the alkali-soluble resin and the quinonediazide compound in the composition.

These surface active agents may be added individually or in combination of several compounds.

The developer for the positive photoresist composition of the present invention may be an aqueous solution of an alkali such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcoholamines (e.g., dimethylethanolamine, triethanolamine), quaternary ammonium salts (e.g., tetramethylammonium hydroxide, tetraethylammonium hydroxide, choline) and cyclic amines (e.g., pyrrole, piperidine). Further, to the aqueous solution of the above-described alkali, an alcohol such as isopropyl alcohol or a surface active agent such as a nonionic surface active agent may be added in an appropriate amount. Among them, quaternary ammonium hydroxides are preferred, and tetramethylammonium hydroxide and choline are particularly preferred.

The positive photoresist composition of the present invention may contain a light absorbent, a crosslinking agent or an adhesion aid, if desired. The light absorbent is used, if desired, for the purpose of preventing halation from the substrate or increasing visibility when the composition is coated on a transparent substrate. Preferred examples of the light absorbent include commercially available light absorbents described in Kogyo-yo Shikiso no Gijutsu to Shijo (Technique and Market of Industrial Dyes), CMC Shuppan, and Senryo Binran (Dye Handbook), Yuki Gosei Kagaku Kyokai (compiler), such as C.I. Disperse Yellow 1,3, 4, 5, 7, 8, 13, 23, 31, 49, 50, 51, 54, 56, 60, 64, 66, 68, 79, 82, 88, 90, 93, 102, 114 and 124, C.I. Disperse Orange 1,5, 13, 25, 29, 30, 31, 44, 57, 72 and 73, C.I. Disperse Red 1,5, 7, 13, 17, 19, 43, 50, 54, 58, 65, 72, 73, 88, 117, 137, 143, 199 and 210, C.I. Disperse Violet 43, C.I. Disperse Blue 96, C.I. Fluorescent Brightening Agent 112, 135 and 163, C.I. Solvent Yellow 14, 16, 33 and 56, C.I. Solvent Orange 2 and 45, C.I. Solvent Red 1,3, 8, 23, 24, 25, 27 and 49, C.I. Pigment Green 10 and C.I. Pigment Brown 2. The light absorbent is usually compounded in an amount of 100 parts by weight or less, preferably 50 parts by weight or less, more preferably 30 parts by weight or less, per 100 parts by weight of the alkali-soluble resin.

The crosslinking agent is used in the range such that the formation of a positive image is not influenced. The object of adding a crosslinking agent is mainly to control sensitivity, to improve heat resistance and to improve dry etching durability.

Examples of the crosslinking agent include a compound resulting from letting formaldehyde act on melamine, benzoguanamine or glycoluril, an alkyl-modified product thereof, an epoxy compound, an aldehyde, an azide compound, an organic peroxide and hexamethylenetetramine. The crosslinking agent may be compounded in a proportion of less than 10 parts by weight, preferably less than 5 parts by weight, per 100 parts by weight of the photosensitive material. If the compounding amount of the crosslinking agent exceeds 10 parts by weight, the sensitivity is liable to be reduced and scum (resist residue) may be generated, thus this is not preferred.

The adhesion aid is added mainly for the purpose of improving adhesion of the resist to the substrate, particularly for preventing the peeling off of the resist during etching. Specific examples of the adhesion aid include chlorosilanes such as trimethylchlorosilane, dimethylvinylchlorosilane, methyldiphenylchlorosilane and chloromethyldimethylchlorosilane, alkoxysilanes such as trimethylmethoxysilane, dimethyldiethoxysilane, methyldimethoxysilane, dimethylvinylethoxysilane, diphenyldimethoxysilane and phenyltriethoxysilane, silazanes such as hexamethyldisilazane, N,N'-bis(trimethylsilyl)urea, dimethyltrimethylsilylamine and trimethylsilylimidazole, silanes such as vinyltrichlorosilane, γ-chloropropyltrimethoxysilane, γ-aminopropyltriethoxysilane and γ-glycidoxypropyltrimethoxysilane, heterocyclic compounds such as benzotriazole, benzimidazole, indazole, imidazole, 2-mercaptobenzimidazole, 2-mercaptobenzothiazole, 2-mercaptobenzoxazole, urazol, thiouracil, mercaptoimidazole and mercapto-pypyrimidine, and urea or thiourea compounds such as 1,1-dimethylurea and 1,3-dimethylurea.

The adhesion aid is compounded in a proportion of usually less than 10 parts by weight, preferably less than 5 parts by weight, per 100 parts by weight of the alkali-soluble resin.

The content of these bonding assistants is usually less than 10 parts by weight, and preferably less than 5 parts by weight per 100 parts by weight of the alkali-soluble resins.

To produce a satisfactory resist, the above-mentioned positive photoresist composition is applied to a substrate as used in manufacture of precision integrated circuit elements (for example, a transparent substrate such as a silicon/silicon dioxide-coated substrate, a glass substrate, and an indium tin oxide substrate) by an appropriate method using a spinner, a coater or the like, and subjected to prebake, exposure through a certain mask, post exposure bake, as needed, development, rinse, and drying.

Examples of the present invention are described below. However, the present invention is not limited by these examples. Unless otherwise indicated, percentage is by weight.

EXAMPLES

SYNTHESIS EXAMPLE (1) Preparation of Compound (I-1):

In a four-necked flask equipped with a stirrer, a reflux condenser, a thermometer, and a dropping funnel, 176.3 g of 4-cyclohexylphenol, 455.8 g of a 25% aqueous solution of tetramethylammonium hydroxide, and 500 ml of distilled water were placed, and heated at 50° C. with stirring to dissolve the 4-cyclohexylphenol. To the resulting solution, 483.4 g of 37% formalin was added dropwise, and still heated with stirring for 8 hours. The resulting reaction mixture was neutralized with hydrochloric acid and a white powder precipitated was filtered off to obtain 160 g of methylol derivatives.

In a similar reaction vessel, 118 g of the methylol derivatives thus obtained, 1.2 kg of 2,5-xylenol, 1 liter of methanol, and 5 g of concentrated sulfuric acid were placed, and refluxed with stirring for 6 hours. The resulting reaction mixture was then poured into 10 liters of distilled water, and a white solid precipitated is subjected to steam distillation to almost completely remove excess 2,5-xylenol, thus obtaining mixture A consisting of derivatives containing 3 nuclei.

Further, in a similar reaction vessel, mixture A thus prepared, 900 g of a 50% aqueous solution of dimethylamine, and 1 liter of ethanol were placed, and stirred to make them homogeneous. To the resulting solution, 810 g of 37% formalin was added dropwise over a period of 1 hour, and the mixture was then refluxed with stirring for 10 hours. After the reaction finished, a white solid precipitated was filtered off to obtain 140 g of aminomethyl derivatives.

In a similar reaction vessel, 140 g of the aminomethyl derivatives and 1 kg of acetic anhydride were placed, and heated with stirring at 150° C. for 15 hours. Excess acetic anhydride was distilled away under reduced pressure, and the residue was dissolved in acetone, and the resulting solution was poured into 1 liter of distilled water to precipitate a white solid which was filtered off and washed with methanol to obtain 175 g of acetoxy derivatives.

Next, 175 g of the acetoxy derivatives thus obtained, 500 g of phenol, 500 ml of methanol, and 25 g of concentrated sulfuric acid were blended and refluxed with stirring for 10 hours. Thereafter, 25 g of concentrated sulfuric acid was added to the mixture and stirred for 10 hours. After the reaction finished, the reaction mixture was poured into 10 liters of distilled water, and a solid obtained was washed with 5 liters of distilled water. The solid had a GPC purity of 87%. The term "GPC purity" as used herein means purity measured by gel permeation chromatography at a wavelength of 282 nm. The solid was purified by column chromatography to obtain 80 g (GPC purity: 97%) of the desired compound (I-1).

SYNTHESIS EXAMPLE (2) Preparation of Compound (II-1):

An intermediate (derivatives containing 3 nuclei) was synthesized via aminometyl derivatives (not via methylol derivatives) in the same manner as in Synthesis Example (1) except that 2-cyclohexyl-5-methylphenol was used in place of 4-cyclohexylphenol as a starting material. Subsequently, in the same manner as in Synthesis EXample (1), Compound (II-1) was prepared.

SYNTHESIS EXAMPLE (3) Preparation of Comparative Compound (III):

o-Cresol was used in place of 2,5-xylenol in synthesis example (1) to synthesize the desired compound (III) (GPC purity 97%). Intermediates (derivatives containing 3 nuclei) were recrystallized from a toluene/hexane mixture. The GPC purity of comparative compound (III) was 72% before undergoing the purification by column chromatography.

SYNTHESIS EXAMPLE (4) Preparation of Photosensitive Material a:

In a three-necked flask, 65.7 g of compound (I-1) (A solid not purified by column chromatography was used), 53.7 g of 1,2-naphthoquinonediazide-5-sulfonyl chloride, and 900 ml of acetone were placed and dissolved uniformly. Subsequently, 20.8 g of N-methylpiperidine was gradually added dropwise and the reaction was continued at 25° C. for 3 hours. The reaction mixture was poured into 3.2 liters of a 1% aqueous solution of hydrochloric acid, and a precipitate thus formed was filtered off, washed with water, and then dried to obtain 105.3 g of 1,2-naphthoquinonediazide-5-sulfonic ester of compound (I-1) (photosensitive material a).

SYNTHESIS EXAMPLE (5) Preparation of Photosensitive Material b:

In a three-necked flask, 65.7 g of compound (I-1) (A powder purified by column chromatography was used), 53.7 g of 1,2-naphthoquinonediazide-5-sulfonyl chloride, and 900 ml of acetone were placed and dissolved uniformly. Subsequently, 20.8 g of N-methylpiperidine was gradually added dropwise, and the reaction was continued at 25° C. for 3 hours. The reaction mixture was poured into 3.2 liters of a 1% aqueous solution of hydrochloric acid, and a precipitate thus formed was filtered off, washed with water, and then dried to obtain 104.5 g of 1,2-naphthoquinonediazide-5-sulfonic ester of compound (I-1) (photosensitive material b).

SYNTHESIS EXAMPLE (6) Preparation of Photosensitive Material c:

In a three-necked flask, 67.1 g of compound (II-1) (A powder purified by column chromatography was used), 53.7 g of 1,2-naphthoquinonediazide-5-sulfonyl chloride, and 1,000 ml of acetone were placed and dissolved uniformly. Subsequently, 20.8 g of N-methylpiperidine was gradually added dropwise, and the reaction was continued at 25° C. for 3 hours. The reaction mixture was poured into 3.2 liters of a 1% aqueous solution of hydrochloric acid, and a precipitate thus formed was filtered off, washed with water, and then dried to obtain 106.5 g of 1,2-naphthoquinonediazide-5-sulfonic ester of compound (II-1) (photosensitive material c).

SYNTHESIS EXAMPLE (7) Preparation of Photosensitive Material d:

In a three-necked flask, 62.9 g of compound (III) (A solid not purified by column chromatography was used), 53.7 g of 1,2-naphthoquinonediazide-5-sulfonyl chloride, and 900 ml of acetone were placed and dissolved uniformly. Subsequently, 20.8 g of N-methylpiperidine was gradually added dropwise, and the reaction was continued at 25° C. for 3 hours. The reaction mixture was poured into 3.2 liters of a 1% aqueous solution of hydrochloric acid, and a precipitate thus formed was filtered off, washed with water, and then dried to obtain 99.7 g of 1,2-naphthoquinonediazide-5-sulfonic ester of compound (III) (photosensitive material d).

SYNTHESIS EXAMPLE 18) Preparation of Photosensitive Material e:

In a three-necked flask, 62.9 g of compound (III) (A powder purified by column chromatography was used), 53.7 g of 1,2-naphthoquinonediazide-5-sulfonyl chloride, and 900 ml of acetone were placed and dissolved uniformly. Subsequently, 20.8 g of N-methylpiperidine was gradually added dropwise, and the reaction was continued at 25° C. for 3 hours. The reaction mixture was poured into 3.2 liters of a 1% aqueous solution of hydrochloric acid, and a precipitate thus formed was filtered off, washed with water, and then dried to obtain 99.2 g of 1,2-naphthoquinonediazide-5-sulfonic ester of compound (III) (photosensitive material e).

SYNTHESIS EXAMPLE (9) Preparation of Novolak Resin A:

After 50 g of m-cresol, 25 g of p-cresol, 28 g of 2,5-xylenol, 53 g of a 37% aqueous solution of formalin, and 0.15 g of oxalic acid were placed, the temperature was raised to 100° C. with stirring, and the mixture was allowed to react for 14 hours.

Thereafter, the temperature was raised to 200° C. and the pressure was gradually reduced to 1 mmHg to distill away water, unreacted monomers, formaldehyde, oxalic acid, and so forth. A fused novolak resin thus obtained was then cooled to room temperature to recover. The novolak resin had a weight average molecular weight of 4,800 (converted to polystyrene). Subsequently, after 20 g of this novolak resin was completely dissolved in 60 g of methanol, 30 g of water was gradually added thereto with stirring to precipitate resin components. The upper layer was removed by decantation to recover the resin components precipitated. The components were heated at 40° C. under reduced pressure for 24 hours to obtain alkali-soluble novolak resin A. Novolak resin A had a weight average molecular weight of 9,960 (converted to polystyrene) and a degree of dispersion of 3.50. The contents of the monomers, dimers, and trimers were 0%, 2.3%, and 3.5%, respectively. Low molecular weight components had been removed by 43% by fractional precipitation.

SYNTHESIS EXAMPLE (10) Preparation of Novolak Resin B:

In a 1-liter three-necked flask equipped with a stirrer, a reflux condenser, and a thermometer, 259.54 g of m-cresol, 9.73 g of p-cresol, 62.31 g of 2,3-xylenol, and 218.14 g of a 37.17% aqueous solution of formalin were placed, and 1.13 g of oxalic acid dihydrate was added to the mixture with stirring at 90° C. After 30 minutes, the bath temperature was raised to 130° C., and the contents were further refluxed with stirring for 3.5 hours. Subsequently, the reflux condenser was replaced by a Liebig condenser, and the bath temperature was raised to 200° C. over a period of about 1 hour to remove unreacted formalin, water, and so forth. Further, after they were distilled away over a period of 1 hour at atmospheric pressure, the pressure was gradually reduced to 1 mmHg to distill away unreacted monomers and others. The time taken to distill away them under reduced pressure was 2 hours.

A fused alkali-soluble novolak resin thus obtained was cooled to room temperature to recover. The weight average molecular weight of the novolak resin was 2,290 (converted to polystyrene).

After 100 g of this novolak resin was dissolved in 1,000 g of acetone, 1,000 g of n-hexane was added thereto with stirring, and the mixture was further stirred for 30 minutes at room temperature. Further, the mixture was then allowed to stand for 1 hour. After the upper layer was removed by decantation, the solvents were distilled away from the residual lower layer by use of a rotary evaporator to obtain solid novolak. Novolak resin B thus obtained had a weight average molecular weight of 5,430 (converted to polystyrene) and a degree of dispersion of 2.4.

SYNTHESIS EXAMPLE (11) Preparation of Novolak Resin C:

After 30 g of p-cresol, 14 g of o-cresol, 50 g of 2,3-dimethylphenol, 20 g of 2,3,5-trimethylphenol, and 4.9 g of 2,6-dimethylphenol were mixed with 50 g of diethylene glycol monomethyl ether, the mixture was placed in a three-necked flask equipped with a stirrer, a reflux condenser, and a thermometer. Subsequently, 85 g of a 37% aqueous solution of formalin was added thereto, and the resulting mixture was heated with stirring in an oil bath kept at 110° C. When the inner temperature was raised to 90° C., 6.3 g of oxalic acid dihydrate was added to the mixture. The mixture was allowed to react in the oil bath kept at 130° C. for 18 hours. The reflux condenser was then removed from the flask, and the mixture was distilled at 200° C. under reduced pressure to remove unreacted monomers. The novolak resin thus obtained had a weight average molecular weight of 3,280 and a degree of dispersion of 2.75.

Preparation and Evaluation of Positive Photoresist Compositions:

EXAMPLES 1 TO 5

To prepare photoresist compositions, photosensitive materials a to c prepared in the above-mentioned synthesis examples (4) to (6), novolak resins A to C prepared in the above-mentioned synthesis examples (9) to (11), solvent, and polyhydroxy compound (p),α,α,α'-tris(4-hydroxyphenyl)-1-ethyl-4-isopropylbenzene, were mixed in proportions shown in Table 1 and dissolved uniformly. The resulting solutions were filtered out through a microfilter made of Teflon which had a pore diameter of 0.10 µm. The photoresist compositions were applied to silicon wafers with the aid of a spinner in which the number of revolution was changed, and dried at 90° C. for 60 seconds on a vacuum adhesion-type hot plate to obtain resist films of 0.97 µm and 1.02 µm in film thickness, respectively.

After each film was exposed to light by use of a reduction-projecting exposure unit (NSR-2005i9C manufactured by Nikon Corp.), it was subjected to post exposure bake at 110° C. for 60 seconds, developed with a 2.38% aqueous solution of tetramethylammonium hydroxide for 1 minute, washed with water for 30 seconds, and then dried.

To evaluate the thus-prepared resists, resist patterns on the silicon wafers thus prepared were observed with the aid of a scanning electron microscope. The obtained results are shown in Table 2.

The sensitivity was defined as a reciprocal of the quantity of exposure required to reproduce a mask pattern of 0.60 µm, and denoted by a relative value to the sensitivity of the resist of comparative example 1, the resist having a film thickness of 0.97 µm. The resolution was represented by the critical resolution in the quantity of exposure to reproduce the mask pattern of 0.60 µm.

Comparative Examples 1 to 5

Comparative resist compositions (shown in Table 1) were prepared and evaluated in the same manner as those prepared in Examples 1 to 5 except that photosensitive materials d and e prepared in Synthesis Examples (7) and (8) were used in place of Photosensitive Materials a to c. The obtained results are shown in Table 2.

TABLE 1

| | Novolak Resin | | Photosensitive Material | | Polyhydroxy Compound (P) | Solvent |
|---|---|---|---|---|---|---|
| | Kind | Content | Kind | Content | Content | Content |
| Example No. | | | | | | |
| 1 | A | 82 | a | 50 | 18 | 400 |
| 2 | B | 73 | a | 60 | 27 | 480 |
| 3 | C | 70 | a | 58 | 30 | 360 |
| 4 | B | 73 | b | 60 | 27 | 480 |
| 5 | A | 75 | c | 55 | 25 | 350 |
| Comparative Example No. | | | | | | |
| 1 | A | 82 | d | 28 | 20 | 370 |
| 2 | A | 82 | d | 53 | 18 | 400 |
| 3 | B | 73 | d | 63 | 27 | 480 |
| 4 | C | 70 | d | 60 | 30 | 360 |
| 5 | B | 73 | e | 62 | 27 | 350 |

TABLE 2

| | Relative Sensitivity | | Resolution (µm) | |
|---|---|---|---|---|
| | Film Thickness 0.97 | Film Thickness 1.02 | Film Thickness 0.97 | Film Thickness 1.02 |
| Example No. | | | | |
| 1 | 1.1 | 1.1 | 0.29 | 0.29 |
| 2 | 1.2 | 1.2 | 0.28 | 0.28 |
| 3 | 1.0 | 1.0 | 0.28 | 0.28 |
| 4 | 1.0 | 1.0 | 0.28 | 0.28 |
| 5 | 1.0 | 1.0 | 0.29 | 0.29 |
| Comparative Example No. | | | | |
| 1 | 1.0 | 1.1 | 0.32 | 0.32 |
| 2 | 1.0 | 1.1 | 0.31 | 0.31 |
| 3 | 1.2 | 1.2 | 0.30 | 0.31 |
| 4 | 1.0 | 1.1 | 0.30 | 0.31 |
| 5 | 0.9 | 1.0 | 0.30 | 0.30 |

The present invention can provide a positive photoresist composition which has high resolution and low dependence of the resolution on film thickness, and leaves little development residue, and has very excellent stability for storage without separation of photosensitive materials and generation of microgel, that is, without observable increase in particle, by introducing an alkyl group or a halogen atom at the 5-position (between methylene chains) to the respective hydroxyl groups of the aromatic rings next to both the terminal rings of a polyhydroxy compound consisting of 5 aromatic rings.

Further, in the present invention, the introduction of the substituent groups at the 5-position causes the resolution to be particularly improved.

While the invention has been described in detail with reference to specific embodiments, it will be apparent to one skilled in the art that various changes and modifications can be made to the invention without departing from its spirit and scope.

What is claimed is:

1. A positive photoresist composition comprising an alkali-soluble resin and at least one of 1,2-naphthoquinonediazide-5-(and/or -4-)sulfonic esters of polyhydroxy compounds represented by formula (I) or (II):

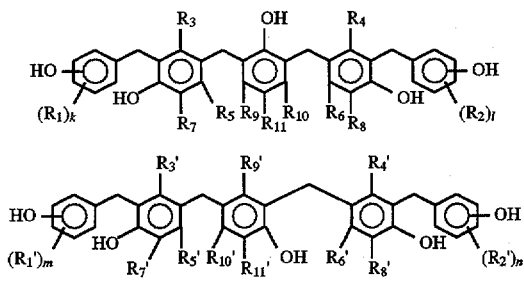

wherein $R_1$, $R_2$, $R_1'$, and $R_2'$, which may be the same or different, each represents a hydrogen atom, a halogen atom, an alkyl group, an aryl group, an alkoxy group, an acyl group, or a cycloalkyl group; $R_3$, $R_4$, $R_3'$, and $R_4'$, which may be the same or different, each represents an alkyl group or a halogen atom; $R_5$, $R_6$, $R_5'$, and $R_6'$, which may be the same or different, each represents a hydrogen atom, an alkyl group, or an alkoxy group; $R_7$, $R_8$, $R_7'$, and $R_8'$, which may be the same or different, each represents an alkyl group, an alkoxy group, an alkenyl group, or a cycloalkyl group; $R_9$, $R_{10}$, $R_9'$, and $R_{10}'$, which may be the same or different, each represents a hydrogen atom or an alkyl group; $R_{11}$ and $R'$ each represents a cycloalkyl group; and k to n each represents an integer of from 0 to 3.

2. The positive photoresist composition of claim 1, wherein the alkyl group represented by $R_1$ to $R_{10}$ and $R_1'$ to $R_{10}'$ is an alkyl group having 1 to 4 carbon atoms, the halogen atom represented by $R_1$ to $R_4$ and $R_1'$ to $R_4'$ is a chlorine atom, a bromine atom, or an iodine atom, the aryl group represented by $R_1$, $R_2$, $R_1'$, and $R_2'$ is a phenyl group, a toluyl group, a xylyl group, a mesityl group, or a cumenyl group, and the alkoxy group represented by $R_1$, $R_2$, $R_5$ to $R_8$, $R_1'$, $R_2'$, and $R_5'$ to $R_8'$ is a methoxy group, an ethoxy group, a propoxy group, an isopropoxy group, an n-butoxy group, an isobutoxy group, a sec-butoxy group, or a tert-butoxy group, the acyl group represented by $R_1$, $R_2$, $R_1'$ and $R_2'$ is a formyl group, an acetyl group, or a benzoyl group, the alkenyl group represented by $R_7$, $R_8$, $R_5'$ and $R_8'$ is a vinyl group, a propenyl group, or an allyl group, and the cycloalkyl group represented by $R_1$ $R_2$, $R_7$, $R_8$, $R_{11}$, $R_1'$, $R_2'$, $R_7'$, $R_8'$, and $R_{11}'$ is a cyclopentyl group or a cyclohexyl group.

3. The positive photoresist composition of claim 1, wherein the total amount of 1,2-naphthoquinone-diazide-5-(and/or -4-)sulfonic esters of polyhydroxy compounds represented by formula (I) or (II) is 5 to 150 parts by weight per 100 parts by weight of the alkali-soluble resin.

4. The positive photoresist composition of claim 1, wherein the alkali-soluble resin is selected from the group consisting of novolak resin, acetone-pyrogallol resin, and polyhydroxystyrene and a derivative thereof.

* * * * *